United States Patent
Lee

(10) Patent No.: US 8,482,359 B2
(45) Date of Patent: Jul. 9, 2013

(54) EQUALIZATION APPARATUS

(75) Inventor: Chao-Cheng Lee, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 329 days.

(21) Appl. No.: 12/874,959

(22) Filed: Sep. 2, 2010

(65) Prior Publication Data
US 2011/0051799 A1 Mar. 3, 2011

Related U.S. Application Data

(60) Provisional application No. 61/239,781, filed on Sep. 3, 2009.

(51) Int. Cl.
*H04B 3/14* (2006.01)
(52) U.S. Cl.
USPC .................................. 333/28 R

(58) Field of Classification Search
USPC .................. 333/28 R, 18; 375/229, 230
See application file for complete search history.

(56) References Cited

U.S. PATENT DOCUMENTS
4,590,600 A * 5/1986 Beeman et al. ............... 375/346

* cited by examiner

*Primary Examiner* — Stephen Jones
(74) *Attorney, Agent, or Firm* — Muncy, Geissler, Olds & Lowe, PLLC

(57) ABSTRACT

This invention provides an equalization apparatus for equalizing an input signal on a cable. The equalization apparatus comprises a cable equalizer for equalizing a cable attenuation effect of the input signal to output a first equalization signal; and a stub equalizer for equalizing a stub effect of the first equalization signal to output an outputting equalization signal.

18 Claims, 8 Drawing Sheets

EQUALIZATION APPARATUS

BACKGROUND OF THE INVENTION (a) Field of the Invention

The invention relates to an equalization apparatus, particularly to an equalization apparatus capable of equalizing a stub effect.

(b) Description of the Related Art

In general, an equalizer located at the receiver end is to equalize a signal attenuation effect on the channel so that the signal is equalized back to the transmitted signal of the transmitter end. However, accompanying with the increase in the data transmission speed, the transmitted signal at the transmitter end has a stub effect due to the stub problem from the printed circuit board.

FIG. 1A shows a transmission system 100. The transmission system 100 comprises a transmitter end 102, a cable line 104, and a receiver end 106 where the transmitter end 102 comprises a high-definition multimedia interface (HDMI) transmitter 108, a display port interface transmitter 110, and a printed circuit board (PCB) metal line 112.

For a system having multiple application specifications, the PCB metal line 112 of the transmitter end 102 may have a branch point, such as the point A. In the case of having a branch point, the transmitted signal Vcable transmitted from the point C at the transmitter end 102 may have a stub effect. The details should be referred to FIG. 1B.

FIG. 1B shows waveform graphs of the transmission signal Va, the transmission signal Vb, and the transmission signal Vcable. As shown in the waveform graphs, when the signal transmitted by the HDMI transmitter 108 hits the branch point A, the transmitted signal is divided into two, that is, the transmission signal Va and the transmission signal Vb. The transmission signal Va is transmitted from the point A directly to the point C while the transmission signal Vb is transmitted from the point A to the point B, then reflected from the point B to the point A, and again transmitted to the point C. Since the transmission signal Vb has to pass through a stub (that is, AB segment) and then be reflected back to the point C, the transmission signal Vb has delay time Td1 compared to the transmission signal Va. Thus, at the point C, after the transmission signal Va combines with the transmission signal Vb, the transmission signal Vcable has a stub effect, that is, delay time Td1. However, if the transmission signal Vcable outputted by the transmitter end 102 has a stub effect, after the signal is attenuated due to passing the transmission line, the data may not be recovered correctly at the receiver end 106.

BRIEF SUMMARY OF THE INVENTION

In light of the above-mentioned problem, one objective of the invention is to provide an equalization apparatus to solve the above problem.

In order to achieve the above objective, the invention provides an equalization apparatus for equalizing an input signal of a cable. The equalization apparatus comprises a cable equalizer for equalizing a cable attenuation effect of the input signal to output a first equalization signal; and a stub equalizer, coupling to the cable equalizer, for equalizing a stub effect of the first equalization signal to output an outputting equalization signal.

In order to have further understanding about the present invention, the embodiments of the invention are described in details accompanying with drawings in the following.

DETAILED DESCRIPTION OF THE INVENTION

Figure 1A:
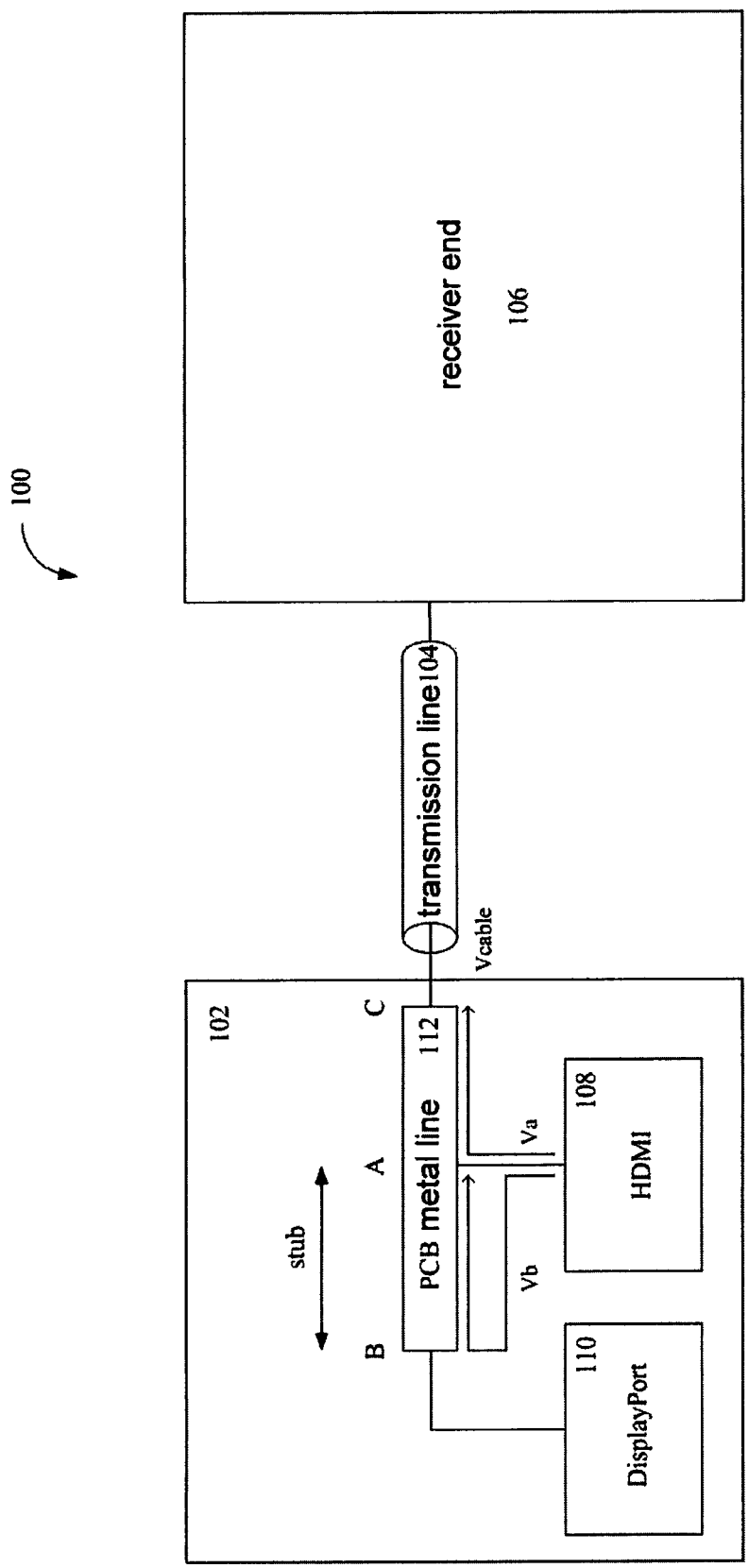
FIG. 1A shows a schematic diagram illustrating a transmission system 100 in the prior art.
Figure 1B:
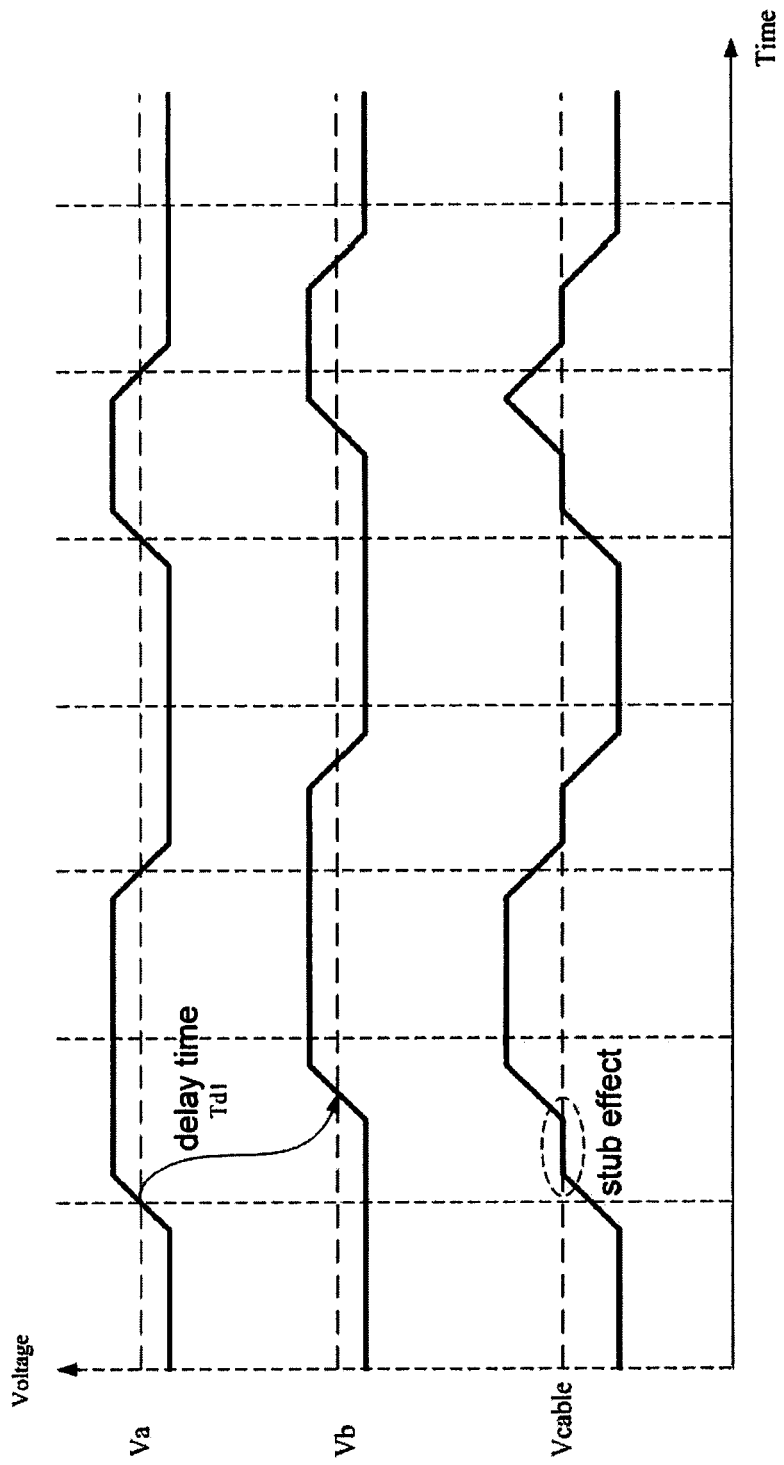
FIG. 1B shows waveform graphs illustrating the signal waveforms in the transmission system 100 in the prior art.
Figure 2:
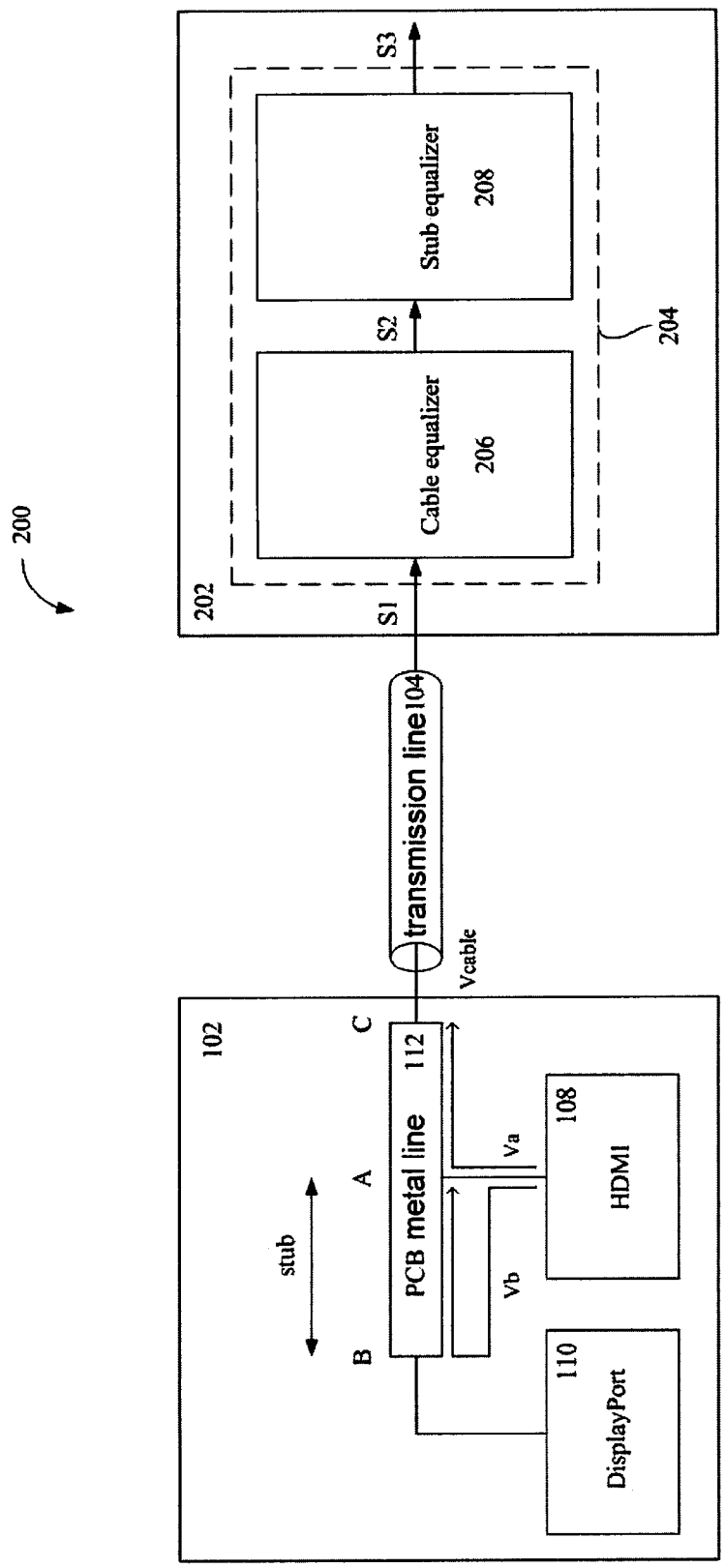
FIG. 2 shows a schematic diagram illustrating a transmission system 200 according to the invention.

One embodiment, referring to FIG. 2, a transmission system 200 is shown. The transmission system 200 comprises a transmitter end 102, a transmission line 104 and a receiver end 202 where the receiver end 202 comprises an equalization apparatus 204 of the present invention. The equalization apparatus 204 further comprises a cable equalizer 206 and a stub equalizer 208. As shown in the figure, the cable equalizer 206 couples to the front end of the stub equalizer 208. In the present invention, the cable equalizer 206 is to equalize a cable attenuation effect of the equalization input signal S1, that is, the cable equalizer 206 is used to equalize the attenuated portion of the equalization input signal S1 due to channel attenuation and to output an equalization signal S2. Then, the stub equalizer 208 equalizes a stub effect of the equalization signal S2 to output an equalization signal S3.

Figure 3:
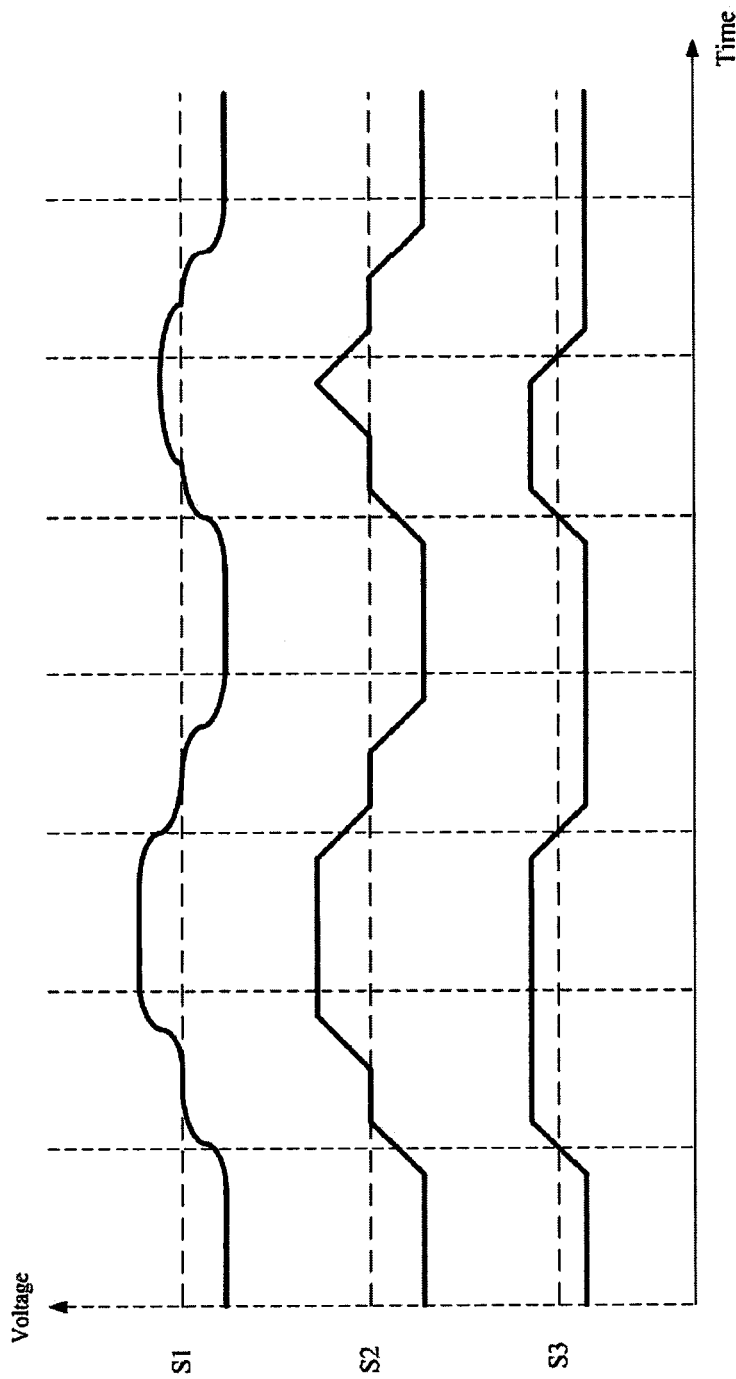
FIG. 3 shows signal waveform graphs in the equalization apparatus 204 according to the invention.

FIG. 3 shows the input and output signal waveform graphs of the equalization apparatus 204. It can be clearly seen from FIG. 3 that the input signal S1 is affected by a cable attenuation effect and is attenuated. After the input signal S1 passes through the cable equalizer 206, the attenuated portion is compensated, as shown in the waveform of the equalization signal S2. In other words, after the input signal S1 passes through the cable equalizer 206, the equalization signal S2 may be a rail-to-rail signal. It should be noted that the equalization signal S2 still has a stub effect. Finally, after the equalization signal S2 passes through the stub equalizer 208, the stub effect is removed so that the data can be recovered correctly, as shown in the waveform of the equalization signal S3.

Figure 4:
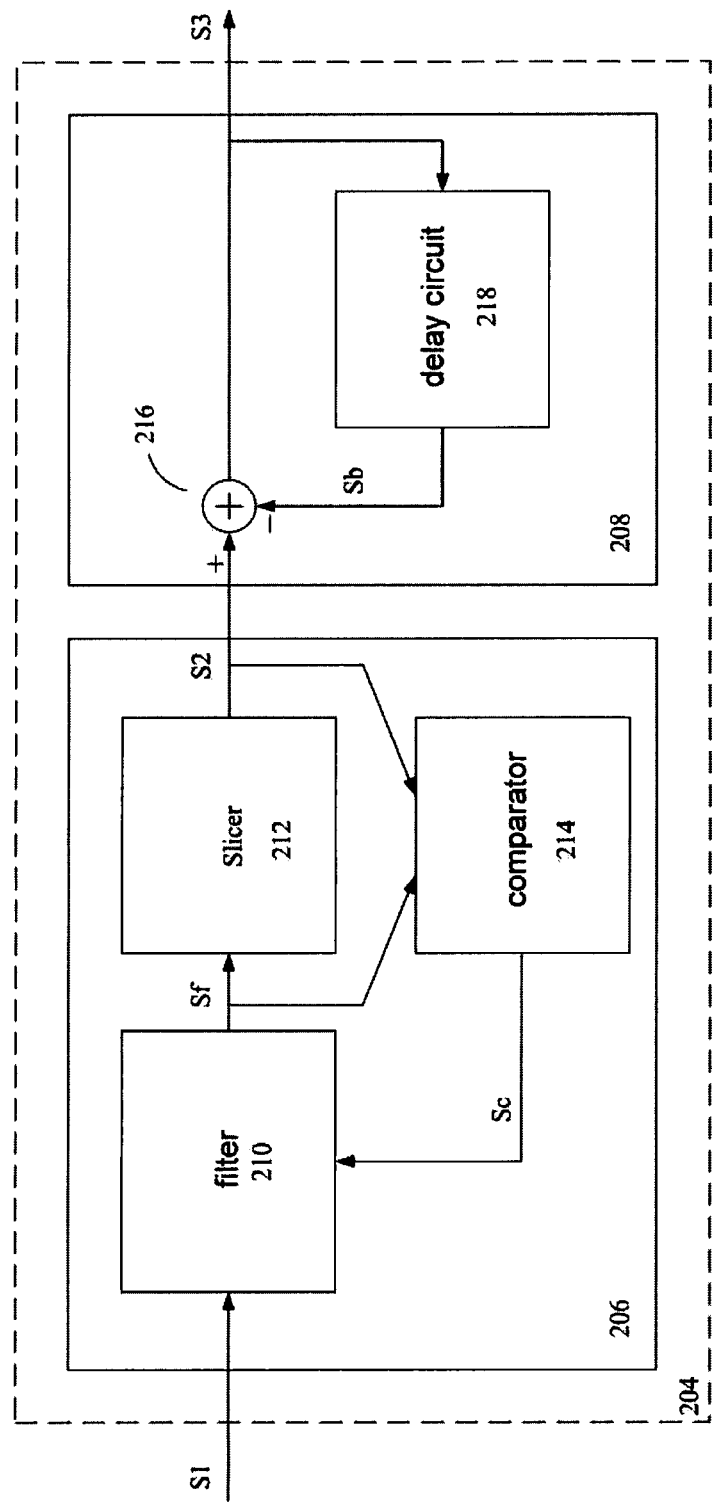
FIG. 4 shows a schematic diagram illustrating the equalization apparatus 204 according to one embodiment of the invention.

FIG. 4 shows a schematic diagram illustrating the equalization apparatus 204 according to an embodiment of the invention. The cable equalizer 206 comprises a filter 210 for filtering the input signal S1 to output a filtered signal Sf; a slicer 212, coupling to the filter 210, for slicing the filtered signal Sf to output the equalization signal S2; and a comparator 214, coupling to the slicer 212, for comparing the filtered signal Sf with the equalization signal S2 to output a control signal Sc to the filter 210 for adjusting the filtering characteristic of the filter 210. It should be noted, because the input signal S1 has a stub effect, in order to correctly equalize the signal and increase the signal equalization effect, according to one embodiment of the invention, the cable equalizer 206 equalizes the input signal S1 without referring to any clock signal while the cable equalizer 206 is under a data transmission mode. In other words, in the present invention, while the cable equalizer 206 is at the starting or initialing state, the initialization is performed by either using the clock gated method or not using the clock gated method.

In an embodiment of the invention, the stub equalizer 208 comprises an operational circuit 216 and a delay circuit 218. The operational circuit 216 performs a subtracting operation on the equalization signal S2 and a feedback delay signal Sd to output the equalization signal S3. The delay circuit 218 delays the equalization signal S3 to output the feedback delay signal Sd.

Figure 5:
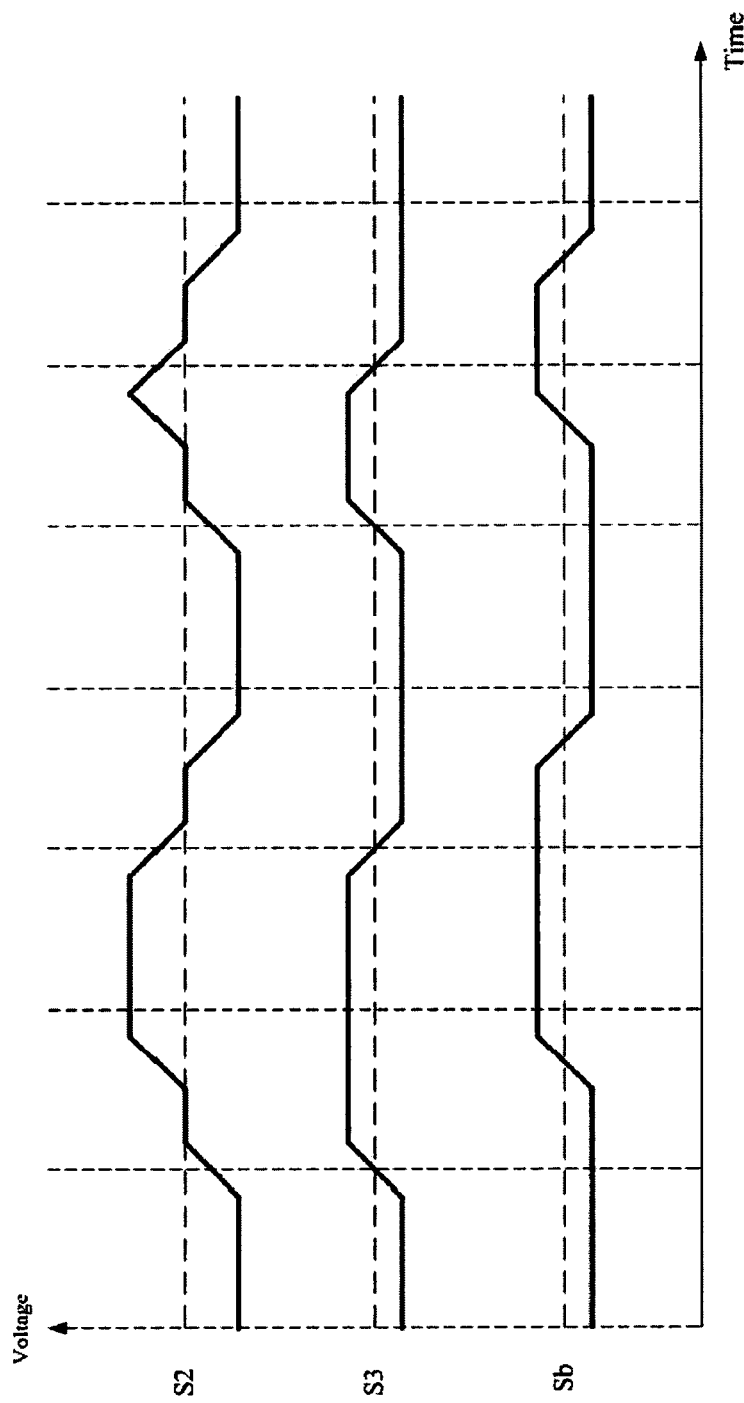
FIG. 5 shows signal waveform graphs in the stub equalizer 208 according to the invention.

FIG. 5 shows signal waveform graphs of the stub equalizer 208. As show in the figure, in order to remove the stub effect, by subtracting the feedback delay signal Sd from the equalization signal S2, the equalization signal S3 is obtained and then outputted, that is, S3=S2−Sd. In addition, in an embodiment of the present invention, the delay time Td2 of the delay circuit 218 may be variable. In order to completely remove the stub effect, the delay time Td2 is dynamically adjusted to be substantially the same as the delay time Td1 of the stub effect. In other words, the delay time Td2 is substantially equal to the delay time Td1 of the stub effect.

Figure 6:
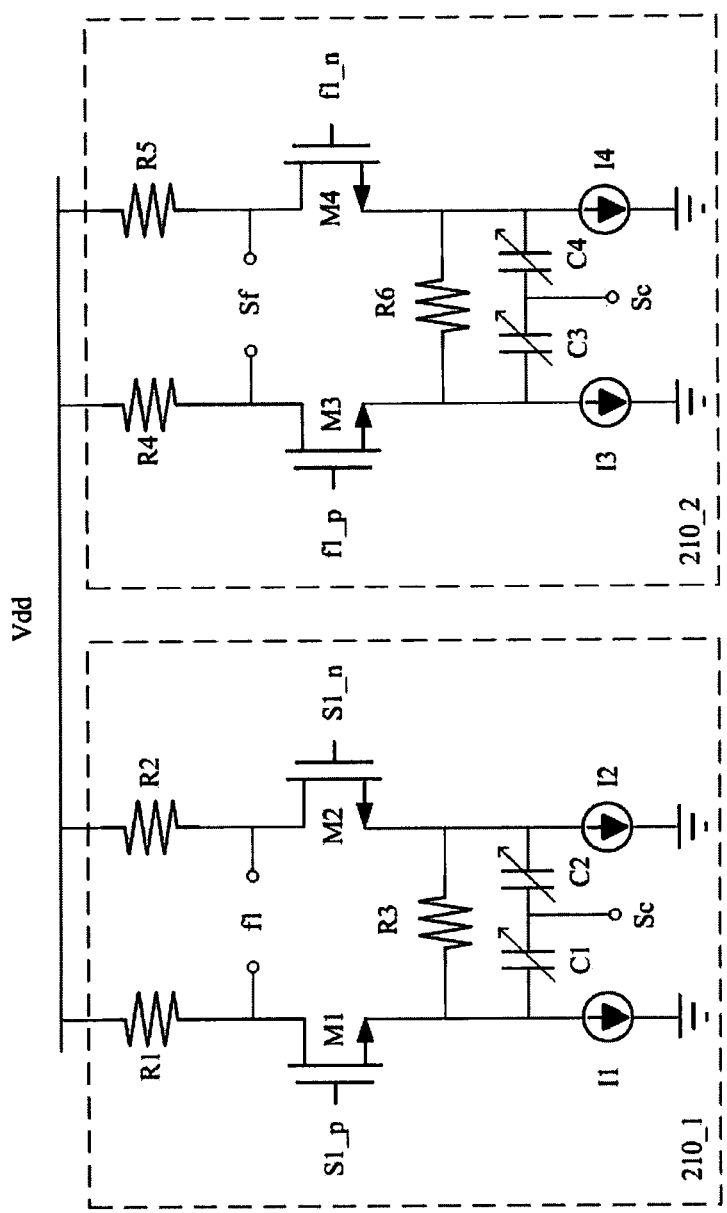
FIG. 6 shows a schematic diagram illustrating the filter 210 according to one embodiment of the invention.

Referring to FIG. 6, the filter 210 according to an embodiment of the present invention is shown. The filter 210 comprises filtering units 210_1 and 210_2. The filtering unit 210_1 comprises transistors M1, M2, resistors R1, R2, R3, variable capacitors C1, C2 and power sources 11, 12. The gate electrodes of the transistors M1, M2 may be used to receive the input signal S1 (the input signal S1 may be divided into signals S1_p and S1_n) and the drain electrodes may be used to output the filtered signal f1 (the filtered signal f1 may be divided into signals f1_p and f1_n) to the filtering unit 210_2. The filtering unit 210_2 comprises transistors M3, M4, resistors R4, R5, R6, variable capacitors C3, C4 and power sources 13, 14. The gate electrodes of the transistors M3, M4 may be used to receive the filtered signal f1 and the drain electrodes may be used to output the filtered signal Sf. From FIG. 6, the filtering characteristic (such as bandwidth or gain) of the filter 210 may be adjusted by controlling the variable capacitors C1, C2, C3, and C4 via the control signal Sc until the filtered signal Sf is substantially equal to the equalization signal S2. It should be noted that using the control signal Sc to control the variable capacitors C1, C2, C3, and C4 for adjusting the filtering characteristic is only an example. The invention is not limited to the above example. A circuit designer can adjust the filtering characteristic through other circuit elements. In addition, the number of connected filtering units may be adjusted whenever needed. The invention is not limited to two filtering units.

Figure 7:
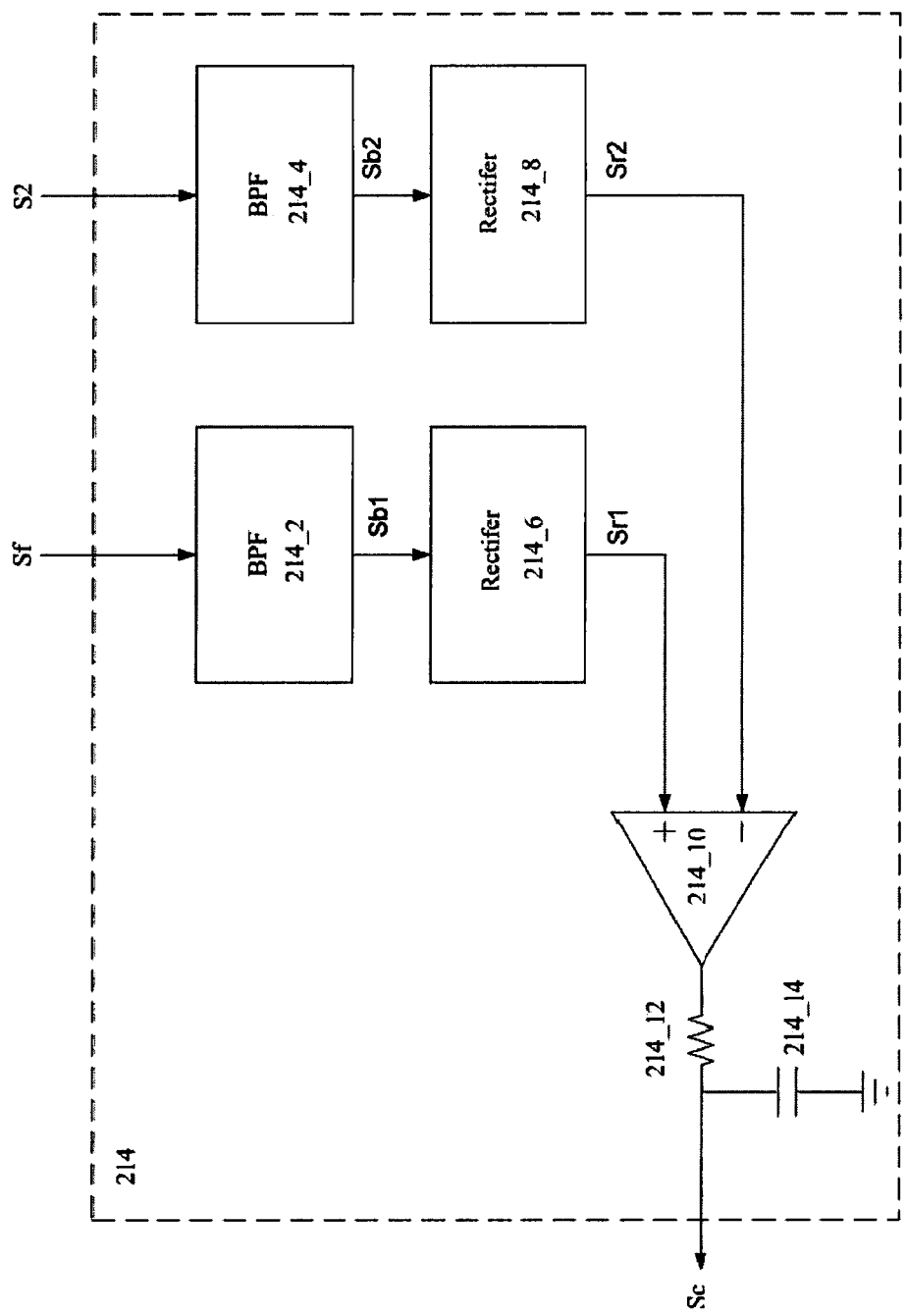
FIG. 7 shows a schematic diagram illustrating the comparator 214 according to one embodiment of the invention.

Referring to FIG. 7, the comparator 214 according to an embodiment of the invention is shown in FIG. 7. The comparator 214 comprises band pass filters (BPF) 214_2, 214_4, rectifiers 214_6, 214_8, a comparing circuit 214_10, a resistor 214_12 and a capacitor 214_14 where their coupling relations are shown in the figure. In this embodiment, the band pass filters 214_2, 214_4 separately perform band pass filtering on the filtered signal Sf and the equalization signal S2 to output the band pass filtered signals Sb1, Sb2. The rectifiers 214_6, 214_8 separately perform signal rectification on the band pass filtered signals Sb1, Sb2 to output the rectified signals Sr1, Sr2. After the comparing circuit 214_10 compares the rectified signals Sr1, Sr2, the comparing circuit 214_10 outputs the control signal Sc to the filter 210.

In conclusion, the equalization apparatus of the invention comprises a cable equalizer 206 and a stub equalizer 208 where the cable equalizer 206 is located at the front end of the stub equalizer 208. Thus, the cable equalizer 206 equalizes the attenuated portion of the input signal S1 due to channel attenuation to generate a rail-to-rail equalization signal S2. Since the signal received by the stub equalizer 208 is a rail-to-rail signal, the correctness of equalization by the stub equalizer 208 is increased. Besides, under the data transmission mode, the cable equalizer 206 operates without referring to any clock signal so that the signal equalization effect is also increased.

Although the present invention has been fully described by the above embodiments, the embodiments should not constitute the limitation of the scope of the invention. Various modifications or changes can be made by those who are skilled in the art without deviating from the spirit of the invention.

What is claimed is:

1. An equalization apparatus, for equalizing an input signal on a cable, comprising:
   a cable equalizer for equalizing a cable attenuation effect of the input signal to output a first equalization signal; and
   a stub equalizer, coupling to the cable equalizer, for equalizing a stub effect of the first equalization signal to output an outputting equalization signal;
   wherein the cable equalizer comprises:
   a filter, for filtering the input signal to output a filtered signal.,
   a slicer, coupling to the filter, for slicing the filtered signal to output the first equalization signal; and
   a comparator, coupling to the slicer, for comparing the filtered signal with the first equalization signal to output a control signal to the filter.

2. The apparatus according to claim 1, wherein the control signal is to control a capacitance of the filter to adjust a filtering characteristic of the filter.

3. The apparatus according to claim 1, wherein the cable equalizer equalizes the input signal without referring to any clock signal while the equalization apparatus is under a data transmission mode.

4. An equalization apparatus, for equalizing an input signal on a cable, comprising:
   a cable equalizer for equalizing a cable attenuation effect of the input signal to output a first equalization signal; and
   a stub equalizer, coupling to the cable equalizer, for equalizing a stub effect of the first equalization signal to output an outputting equalization signal;
   wherein the cable equalizer comprises:
   an operational circuit, for performing an operation on the first equalization signal and a feedback delay signal to output the outputting equalization signal; and
   a delay circuit, coupling to the operational circuit, for delaying the outputting equalization signal to output the feedback delay signal.

5. The apparatus according to claim 4, wherein the cable equalizer equalizes the input signal without referring to any clock signal while the equalization apparatus is under a data transmission mode.

6. The apparatus according to claim 4, wherein the delay circuit has a delay quantity and the delay quantity is variable.

7. The apparatus according to claim 4, wherein the delay circuit has delay time and the delay time is substantially equal to the delay time generated by the stub effect.

8. An equalization apparatus, for equalizing an input signal on a cable, comprising:
   a first equalizer for equalizing a cable attenuation effect of the input signal to output a first equalization signal; and
   a second equalizer, coupling to the first equalizer, for equalizing a stub effect of the first equalization signal to output an outputting equalization signal; wherein the first equalizer comprises:
   a filter, for filtering the input signal to output a filtered signal;

a slicer, coupling to the filter, for slicing the filtered signal to output the first equalization signal; and a comparator, coupling to the slicer, for comparing the filtered signal with the first equalization signal to output a control signal to the filter.

9. The apparatus according to claim 8, wherein the control signal is to control a capacitance in the filter to adjust a filtering characteristic of the filter.

10. The apparatus according to claim 8, wherein the first equalizer equalizes the input signal without referring to any clock signal while the equalization apparatus is under a data transmission mode.

11. The apparatus according to claim 8, wherein the second equalizer comprises:

an operational circuit, for performing an operation on the first equalization signal and a feedback delay signal to output the outputting equalization signal; and a delay circuit, coupling to the operational circuit, for delaying the outputting equalization signal to output the feedback delay signal.

12. The apparatus according to claim 11, wherein the first equalizer equalizes the input signal without referring to any clock signal while the equalization apparatus is under a data transmission mode.

13. The apparatus according to claim 11, wherein the delay circuit has a delay quantity and the delay quantity is variable.

14. The apparatus according to claim 11, wherein the delay circuit has delay time and the delay time is substantially equal to the delay time generated by the stub effect.

15. An equalization apparatus, for equalizing an input signal on a cable, comprising:

a first equalizer for equalizing a cable attenuation effect of the input signal to output a first equalization signal; and a second equalizer, coupling to the first equalizer, for equalizing a stub effect of the first equalization signal to output an outputting equalization signal;

wherein the second equalizer comprises:

an operational circuit, for performing an operation on the first equalization signal and a feedback delay signal to output the outputting equalization signal; and a delay circuit, coupling to the operational circuit, for delaying the outputting equalization signal to output the feedback delay signal.

16. The apparatus according to claim 15, wherein the first equalizer equalizes the input signal without referring to any clock signal while the equalization apparatus is under a data transmission mode.

17. The apparatus according to claim 15, wherein the delay circuit has a delay quantity and the delay quantity is variable.

18. The apparatus according to claim 15, wherein the delay circuit has delay time and the delay time is substantially equal to the delay time generated by the stub effect.

* * * * *